United States Patent
Kim et al.

(10) Patent No.: US 9,627,651 B2
(45) Date of Patent: Apr. 18, 2017

(54) METHODS OF MANUFACTURING OPTICAL SHEETS, ORGANIC LIGHT EMITTING DISPLAY DEVICES HAVING OPTICAL SHEETS AND METHODS OF MANUFACTURING ORGANIC LIGHT EMITTING DISPLAY DEVICES HAVING OPTICAL SHEETS

(71) Applicant: Samsung Display Co., Ltd., Yongin-si, Gyeonggi-do (KR)

(72) Inventors: Ki-Seo Kim, Yongin-si (KR); Rang-Kyun Mok, Yongin-si (KR); Jong-In Baek, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 583 days.

(21) Appl. No.: 13/766,366

(22) Filed: Feb. 13, 2013

(65) Prior Publication Data
US 2013/0299785 A1 Nov. 14, 2013

(30) Foreign Application Priority Data
May 9, 2012 (KR) .................. 10-2012-0049193

(51) Int. Cl.
*H01L 51/56* (2006.01)
*H01L 51/52* (2006.01)
*G02B 5/02* (2006.01)

(52) U.S. Cl.
CPC ........ *H01L 51/5268* (2013.01); *G02B 5/0242* (2013.01); *G02B 5/0278* (2013.01); *H01L 51/56* (2013.01); *Y10T 156/1082* (2015.01)

(58) Field of Classification Search
CPC ............. H01L 51/5268; H01L 51/5369; H01L 51/5256; H01L 51/56
See application file for complete search history.

(56) References Cited

U.S. PATENT DOCUMENTS

| 6,025,894 A | 2/2000 | Shirasaki et al. |
| 6,501,218 B1 | 12/2002 | Duggal et al. |
| 6,985,196 B2 | 1/2006 | Otake et al. |
| 7,345,419 B2 | 3/2008 | Gotoh et al. |

(Continued)

FOREIGN PATENT DOCUMENTS

| CN | 1463368 | 12/2003 |
| CN | 1577414 | 2/2005 |

(Continued)

OTHER PUBLICATIONS

Office Action dated Apr. 28, 2016 in corresponding Chinese Patent Application No. 201310166986.5.
(Continued)

*Primary Examiner* — Matthew Landau
*Assistant Examiner* — Scott Stowe
(74) *Attorney, Agent, or Firm* — Knobbe Martens Olson & Bear LLP

(57) ABSTRACT

In a method of manufacturing an optical sheet, a stacked structure may be formed by alternatively and repeatedly stacking at least one transparent layer and at least one light scattering layer. A first cut face may be formed by partially cutting the stacked structure. A second cut face may be formed by partially cutting the stacked structure. The second cut face may be parallel to the first cut face.

14 Claims, 13 Drawing Sheets

(56) References Cited

U.S. PATENT DOCUMENTS

| | | |
|---|---|---|
| 7,420,322 B2 | 9/2008 | Takei et al. |
| 8,314,547 B2 | 11/2012 | Klein et al. |
| 8,339,426 B2 | 12/2012 | Kamada |
| 2005/0238852 A1 | 10/2005 | Nakayama et al. |
| 2005/0243428 A1 | 11/2005 | Takahashi et al. |
| 2006/0176421 A1 | 8/2006 | Utsumi et al. |
| 2009/0091258 A1* | 4/2009 | Heuser .............. H01L 33/50 313/512 |
| 2009/0128740 A1 | 5/2009 | Lee et al. |
| 2010/0011925 A1* | 1/2010 | Lim et al. .............. 83/56 |
| 2010/0033078 A1 | 2/2010 | Lee et al. |
| 2011/0006316 A1* | 1/2011 | Ing .............. G02F 1/133606 257/89 |
| 2012/0256218 A1* | 10/2012 | Kwack et al. .............. 257/98 |

FOREIGN PATENT DOCUMENTS

| | | |
|---|---|---|
| CN | 1836468 | 9/2006 |
| CN | 101657676 | 2/2010 |
| JP | 10-189237 | 7/1998 |
| JP | 2000-075132 | 3/2000 |
| JP | 2002-277613 | 9/2002 |
| JP | 2003-315515 | 11/2003 |
| JP | 2005-032537 | 2/2005 |
| JP | 2005-050708 | 2/2005 |
| JP | 2007-171539 | 7/2007 |
| JP | 2009-76911 A | 4/2009 |
| KR | 10-2006-0094160 | 8/2006 |
| KR | 10-2009-0059212 | 6/2009 |
| KR | 10-2011-0071530 | 6/2011 |
| TW | 1221748 | 6/1993 |
| TW | 200535503 A1 | 3/1994 |

OTHER PUBLICATIONS

Office Action dated Aug. 24, 2016 in corresponding Taiwanese Patent Application No. 102107170.

Office Action dated Aug. 23, 2016 in corresponding Japanese Patent Application No. 2012-255391.

* cited by examiner

METHODS OF MANUFACTURING OPTICAL SHEETS, ORGANIC LIGHT EMITTING DISPLAY DEVICES HAVING OPTICAL SHEETS AND METHODS OF MANUFACTURING ORGANIC LIGHT EMITTING DISPLAY DEVICES HAVING OPTICAL SHEETS

CROSS-REFERENCE TO RELATED APPLICATIONS

This application claims priority to Korean Patent Application No. 10-2012-0049193 filed on May 9, 2012 in the Korean Intellectual Property Office (KIPO), the contents of which are herein incorporated by reference in its entirety.

BACKGROUND

Field

Example embodiments relate to methods of manufacturing optical sheets having an improved optical characteristic, organic light emitting display devices including optical sheets having improved optical characteristics and methods of manufacturing organic light emitting display devices including optical sheets having improved optical characteristics.

Description of the Related Technology

An organic light emitting display (OLED) device may display desired information such as images, letters and/or characters using a light generated by combining holes provided from an anode with electrons provided from a cathode in an organic layer thereof. The OLED device may ensure relatively large viewing angle, rapid response speed, small thickness, low power consumption, etc. Accordingly the OLED device may be one of the most prospecting next-generation display devices.

In the conventional OLED device, when the light generated from a display panel emits along a lateral direction rather than a front direction, the wavelength of the emitted light may shift according to an increase in the viewing angle (that is, a color shift phenomenon). The color shift phenomenon may degrade quality of images, and thus need to be reduced.

SUMMARY OF CERTAIN INVENTIVE ASPECTS

Example embodiments provide methods of manufacturing optical sheets having improved optical characteristics.

Example embodiments provide organic light emitting display devices including optical sheets having improved optical characteristics.

Example embodiments provide methods of manufacturing organic light emitting display devices including optical sheets having improved optical characteristics.

According to example embodiments, there is provided a method of manufacturing an optical sheet. In the method, a stacked structure may be formed by alternatively and repeatedly stacking at least one transparent layer and at least one light scattering layer. A first cut face may be formed by partially cutting the stacked structure. A second cut face may be formed by partially cutting the stacked structure. The second cut face may be substantially parallel to the first cut face.

In example embodiments, a distance between the first cut face and the second cut face may correspond to a thickness of the optical sheet.

In example embodiments, the first cut face and the second cut face may be substantially perpendicular to an interface between the transparent layer and the light scattering layer.

In example embodiments, forming the stacked structure may comprise repeatedly performing a cycle including forming one light scattering layer on one transparent layer and forming another transparent layer on the light scattering layer.

In example embodiments, forming the stacked structure may comprise providing a plurality of transparent layers, providing a plurality of light scattering layers, alternatively arranging the transparent layers and the light scattering layers and laminating the transparent layers and the light scattering layers.

In example embodiments, each of the light scattering layers may include a transparent adhesive and a plurality of light scattering particles.

In example embodiments, adhesion layers may be further formed between the transparent layers and the light scattering layers, respectively.

In example embodiments, each of the transparent layers may have an identical thickness, and each of the light scattering layers may have an identical thickness.

In example embodiments, transparent layers respectively may have different thicknesses and the light scattering layers respectively may have different thicknesses.

In example embodiments, each of the light scattering layers may comprise light scattering particles having one of a sphere shape, a disk shape, a bubble shape or a polygonal shape.

According to example embodiments, there is provided an organic light emitting display device including a display panel, a first optional sheet and a second optional sheet. The display panel may include a switching device, a first electrode, an organic light emitting structure and a second electrode. The display panel may have a plurality of pixel regions and a peripheral region enclosing the pixel regions. The pixel regions may be arranged in a first direction and a second direction perpendicular to the first direction. The first optical sheet may include first light scattering patterns and first transparent patterns extending in the first direction on the display panel, adjacent first light scattering patterns and adjacent first transparent patterns being spaced apart in the second direction. The second optical sheet may include second light scattering patterns and second transparent patterns extending in the second direction on the first optical sheet, adjacent second light scattering patterns and adjacent second transparent patterns being spaced apart in the first direction.

In example embodiments, a width of each first transparent pattern may be larger by a factor of an integer than a width of each pixel region, and a width of each second transparent pattern may be larger by a factor of an integer than a height of each pixel region.

In example embodiments, the first light scattering patterns and the second light scattering patterns may be arranged to be overlapped with the peripheral region of the display panel.

According to example embodiments, there is provided a method of manufacturing an organic light emitting display device. In the method, a display panel may be formed to include a switching device, a first electrode, an organic light emitting structure and a second electrode. The display panel may have a plurality of pixel regions and a peripheral region surrounding the pixel regions. The pixel regions may be arranged in a first direction and a second direction perpendicular to the first direction. An optical sheet may be formed on the display panel. In the method of forming the optical sheet, a stacked structure may be formed by alternatively stacking at least one transparent layer and at least one light scattering layer. A first cut face may be formed by partially cutting the stacked structure and a second cut face may be formed by partially cutting the stacked structure. The second cut face may be parallel to the first cut face. At least one optical sheet may be formed to include light scattering patterns and transparent patterns extending in the first direction, adjacent light scattering patterns and adjacent transparent patterns being spaced apart in the second direction.

In example embodiments, a distance between the first cut face and second cut face may be a thickness of the optical sheet.

In example embodiments, the first cut face and the second cut face may be perpendicular to an interface between the transparent layer and the light scattering layer.

In example embodiments, the transparent patterns may have same widths and the light scattering patterns may have equal widths.

In example embodiments, the widths of the transparent patterns may be larger by a factor of an integer than widths or heights of the pixel regions.

In example embodiments, forming the optical sheet on the display panel may include forming a first optical sheet including first light scattering r patterns and first transparent patterns extending in the first direction on the display panel, adjacent first light scattering patterns and adjacent first transparent patterns being spaced apart in the second direction and forming a second optical sheet including second light scattering patterns and second transparent patterns extending in the second direction on the first optical sheet, adjacent second light scattering patterns and adjacent second transparent patterns being spaced apart in the first direction.

According to example embodiments, an optical sheet including transparent patterns and light scattering patterns arranged alternatively and repeatedly may be obtained avoid of performing a patterning process such as a photolithography. When the optical sheet is applied to an organic light emitting display device, the optical sheet may not reduce a brightness of the light emitted along a front direction of the organic light emitting display device, and may alleviate a color shift phenomenon. Therefore, quality of images may be improved.

BRIEF DESCRIPTION OF THE DRAWINGS

Example embodiments will be more clearly understood from the following detailed description taken in conjunction with the accompanying drawings.

FIGS. 1 to 5 are perspective views illustrating a method of manufacturing an optical sheet in accordance with example embodiments;

FIGS. 6 to 8 are perspective views illustrating a method of manufacturing an optical sheet in accordance with other example embodiments;

FIGS. 9 to 12 are perspective views illustrating a method of manufacturing an optical sheet in accordance with other example embodiments;

FIGS. 13 and 14 is a perspective view and a cross-sectional view illustrating an organic light emitting display device in accordance with example embodiments; and FIGS. 15 and 16 are cross-sectional views illustrating a method of manufacturing an organic light emitting display device in accordance with example embodiments.

DETAILED DESCRIPTION OF CERTAIN INVENTIVE EMBODIMENTS

Figure 1:
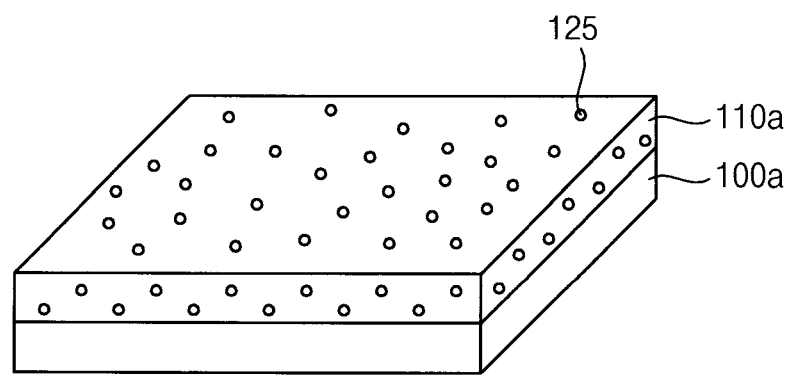
FIGS. 1 to 16 represent non-limiting, example embodiments as described herein.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numerals generally refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising" specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 5 are perspective views illustrating a method of manufacturing an optical sheet in accordance with example embodiments.

Referring to FIG. 1, a first light scattering layer 110a may be formed on a first transparent layer 100a.

The first transparent layer 100a may include an organic material having a predetermined strength and a predetermined transparency. For example, the first transparent layer 100a may include a transparent resin such as polyethylene terephthalate resin, polyester resin, polyacryl resin, polyepoxy resin, polyethylene resin, polystyrene resin, polyethylene naphthalate resin, polycarbonate resin, polyvinyl chloride resin, polypropylene resin, cyclo olefin copolymer, triacetyl cellulose, a mixture thereof, etc. The first transparent layer 100a may have a predetermined thickness. In example embodiments, the thickness of the first transparent layer 100a may substantially correspond to a height or a width of a pixel region of a display panel. For example, the thickness of the first transparent layer 100a may be larger by a factor of an integer than the height or the width of the pixel region of the display panel (See FIG. 13).

The first light scattering layer 110a may be formed on the first transparent layer 100a. In example embodiments, the first light scattering layer 110a may be formed by a dip coating process, a spin coating process, a screen coating process, a spray coating process, a knife coating process, a gravure coating process, an ultrasonic atomizing coating process, a spray-mist atomizing coating process, an offset printing process, an inkjet printing process, a pad printing process, etc.

In example embodiments, the first light scattering layer 110a may be formed on the first transparent layer 100a by a spin coating process using a coating solution including light scattering particles 125. For example, the light scattering particles 125 may have various shapes such as a substantially spherical shape, a substantial disk-shape, a substantial bubble-shape, a substantially polygonal shape, etc.

The first light scattering layer 110a may have a predetermined thickness. In example embodiments, the thickness of the first light scattering layer 110a may substantially correspond to a width of a peripheral region of the display panel (See FIG. 13).

Figure 2:
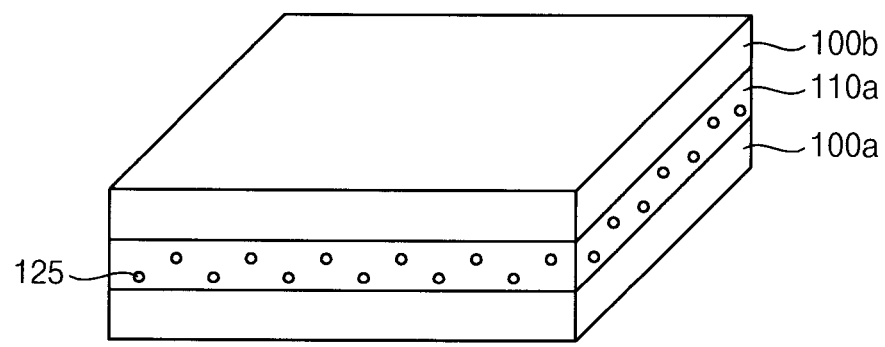

Referring to FIG. 2, a second transparent layer 100b may be formed on the first light scattering layer 110a.

In example embodiments, the second transparent layer 100b may be formed by a dip coating process, a spin coating process, a screen coating process, a spray coating process, a knife coating process, a gravure coating process, an ultrasonic atomizing coating process, a spray-mist atomizing coating process, an offset printing process, an inkjet printing process or a pad printing process.

The second transparent layer 100b may be formed using a resin substantially the same as, or substantially similar to that of, the first transparent layer 100a. Alternatively, the second transparent layer 100b may be formed using a resin different from that included in the first transparent layer 100a.

In example embodiments, the second transparent layer 100b may have a thickness substantially the same as, or substantially similar to that of, the first transparent layer 100a. Alternatively, the second transparent layer 100b may have a thickness different from that of the first transparent layer 100a.

Figure 3:
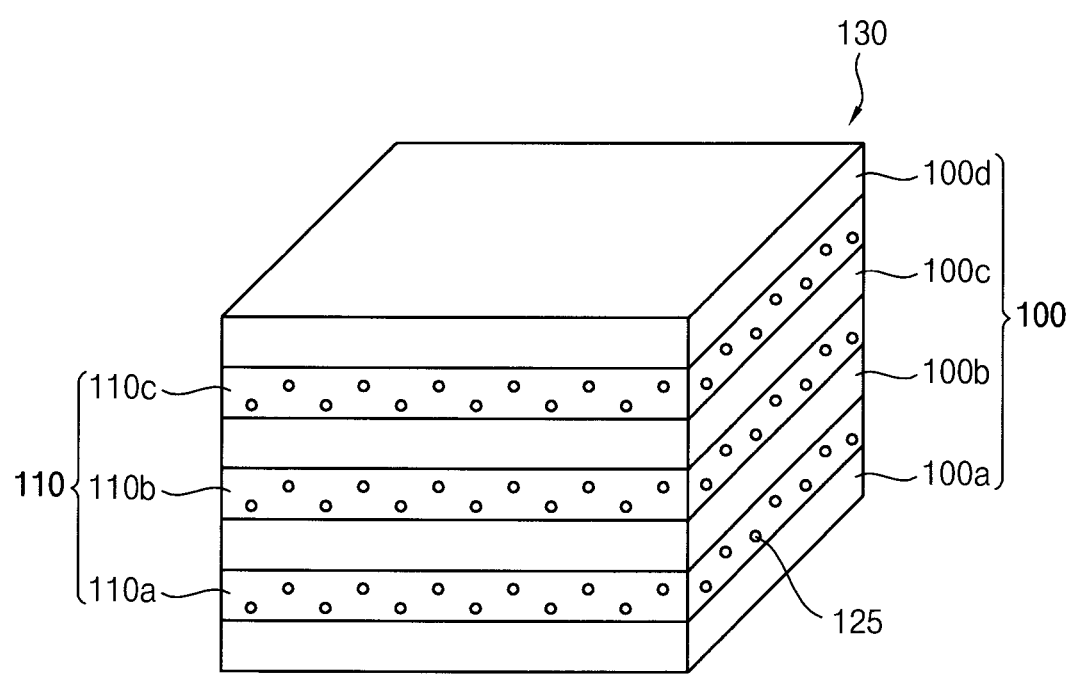

Referring to FIG. 3, the processes for forming the first and the second transparent layers 100a and 100b and the first light scattering layer 110a may be performed repeatedly to form a stacked structure 130 having a plurality of transparent layers 100 and a plurality of light scattering layers 110, which may be stacked alternatively and repeatedly.

A cycle of formation processes may be performed repeatedly to form the stacked structure 130, and the cycle may include a formation process of the transparent layer and a formation process of the light scattering layer described with reference to FIGS. 1 and 2. For example, a second light scattering layer 110b may be formed on the second transparent layer 100b by the formation process, a third transparent layer 100c may be formed on the second light scattering layer 110b, and a third light scattering layer 110c may be formed on the third transparent layer 100c. Further, a fourth transparent layer 100d may be formed on the third light scattering layer 110c.

In example embodiments, each of the transparent layers 100 may have substantially the same thickness, and also each of the light scattering layers 110 may have substantially the same thickness. Alternatively, the transparent layers 100 may have thicknesses different from one another, and also the light scattering layers 110 may have thicknesses different from one another.

For convenience of illustration and description, the stacked structure 130 may include four transparent layers 100 and three light scattering layers 110 as illustrated in FIG. 3, however, the invention is not limited to the illustration. For example, the processes for forming the transparent layers 100 and the processes for forming the light scattering layers 110 may be repeated up to hundreds of times or thousands of times. Therefore, the stacked structure 130 may include hundreds or thousands of the light scattering layers 110 and the transparent layers 100 which may be stacked alternatively and repeatedly. In example embodiments, the number of the light scattering layers 110 and the transparent layers 100 may correspond to the number of pixels in one row or in one column of the display panel (See FIG. 13).

Figure 4:
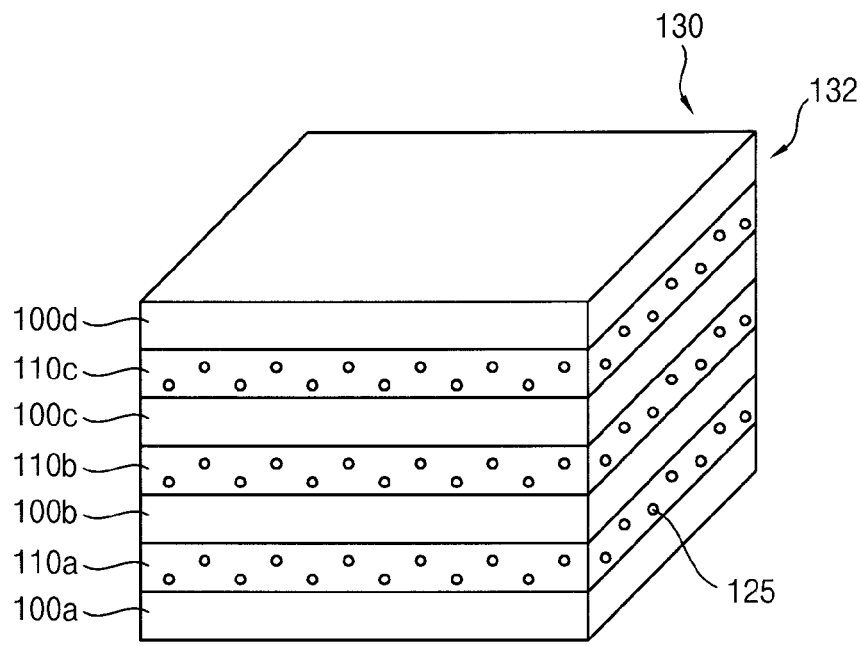

Referring to FIG. 4, the stacked structure 130 may be partially cut to provide a first cut face 132.

A first portion of the stacked structure 130 may be cut by an optical method, a physical method, a thermal method, a chemical method or a combination thereof. In one example embodiment, the first portion of the stacked structure 130 may be cut using a laser cutting machine. In another example embodiment, the first portion of the stacked structure 130 may be cut using a rotary cutting blade.

The first cut face 132 may be obtained as described above. The first cut face 132 may have a predetermined angle with respect to interfaces among the transparent layers 100 and the light scattering layers 110. For example, the first cut face 132 may be substantially perpendicular to the interfaces among the transparent layers 100 and the light scattering layers 110.

Figure 5:
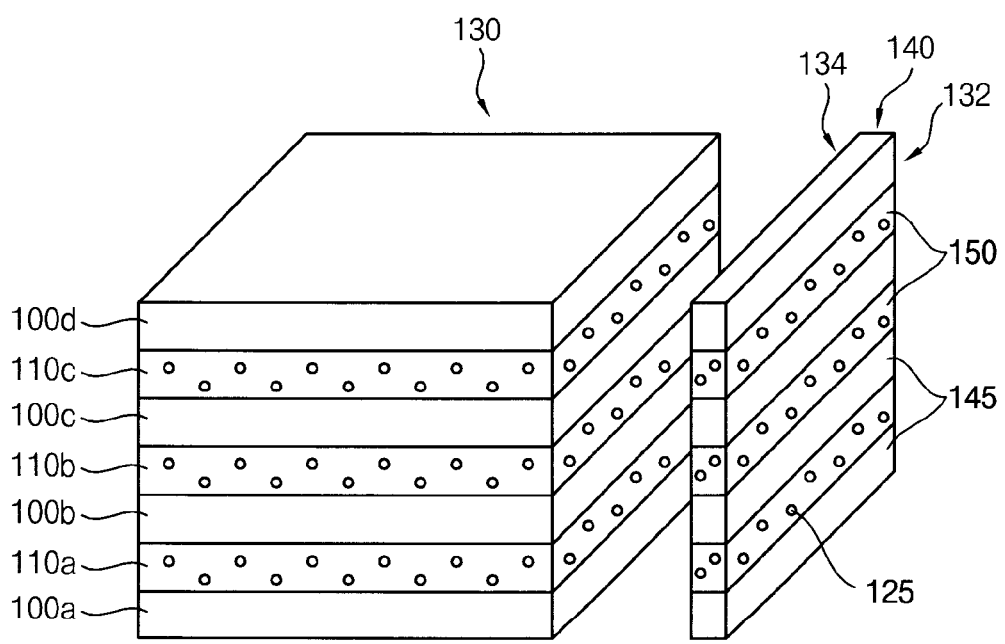

Referring to FIG. 5, the stacked structure 130 may be partially cut to provide a second cut face 134 to thereby form an optical sheet 140.

A second portion of the stacked structure 130 having the first cut face 132 may be cut by an optical method, a physical method, a thermal method, a chemical method or a combination thereof. For example, the method of cutting the second portion of the stacked structure 130 may be substantially the same as the method described with reference to FIG. 4.

The second cut face 134 may be obtained as described above. The second cut face 134 may substantially oppose to the first cut face 132. In example embodiments, the second cut face 134 may be substantially parallel to the first cut face 132. Further, the second cut face 134 may be spaced apart from the first cut face 132 by a distance of about 5 μm to about 1,000 μm.

By the above-described cutting processes, the optical sheet 140 having the first cut face 132 and the second cut face 134 may be obtained. A thickness of the optical sheet 140 may be substantially the same as a distance between the first cut face 132 and the second cut face 134. Additionally, the optical sheet 140 may include a plurality of transparent patterns 145 and a plurality of light scattering patterns 150 which may extend in a direction.

For convenience of illustration and description, the process for forming the first cut face 132 and the process for forming the second cut face 134 may be depicted to be performed successively, the invention may not be limited to the illustration. For example, the process for forming the first cut face 132 and the process for forming the second cut face 134 may be performed simultaneously.

According to example embodiments, the optical sheet 140 having a plurality of transparent patterns 145 and a plurality of light scattering patterns 150 arranged alternatively and repeatedly may be formed without performing any patterning process such as a photolithography process or an etching process using an additional etching mask. When the optical sheet 140 is employed on the display panel, the optical sheet 140 may not reduce brightness of light emitted along a front direction of the display panel, and may reduce or prevent color shift phenomenon. Therefore, quality of images on the display panel may be improved.

Figure 6:
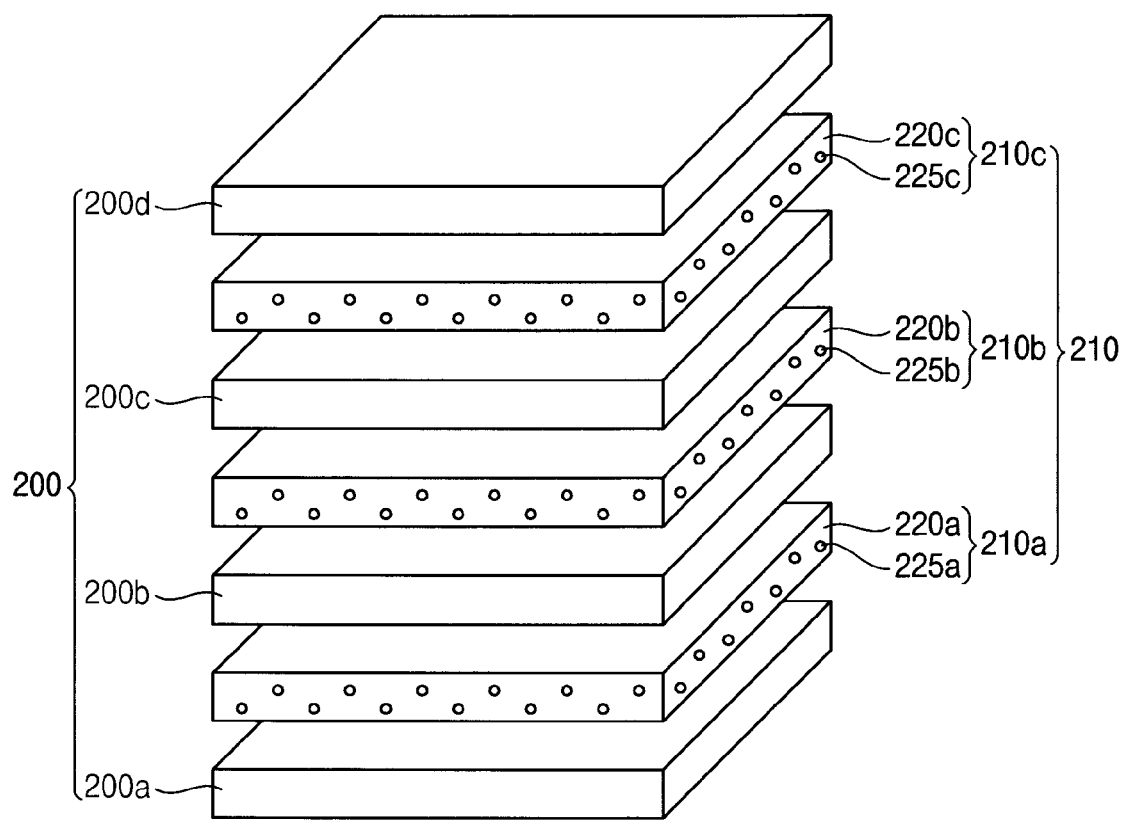
Figure 7:
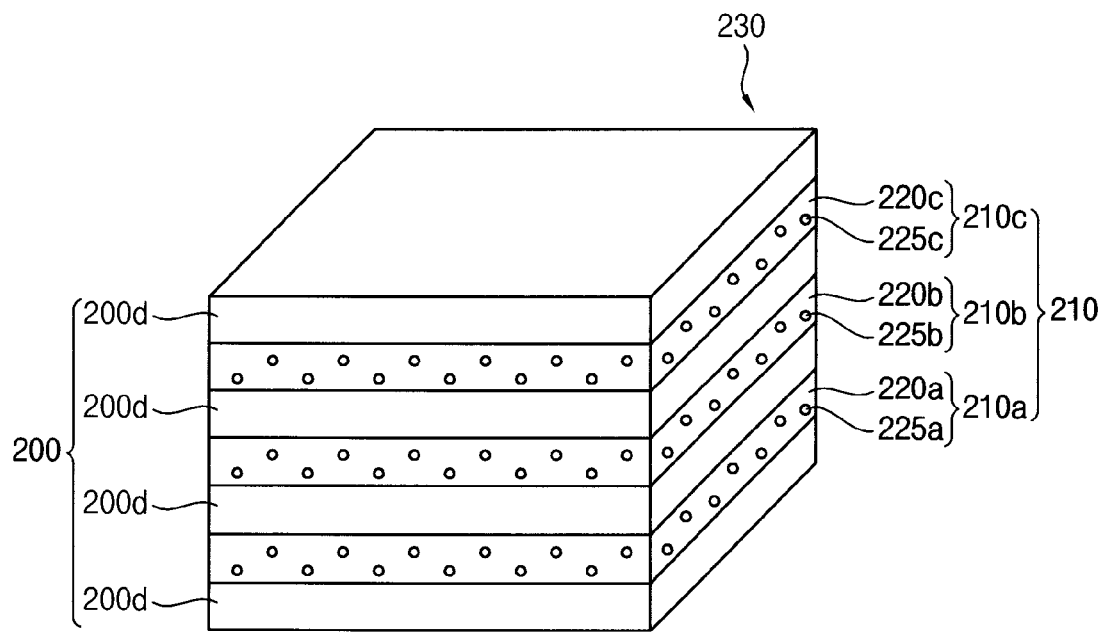
Figure 8:
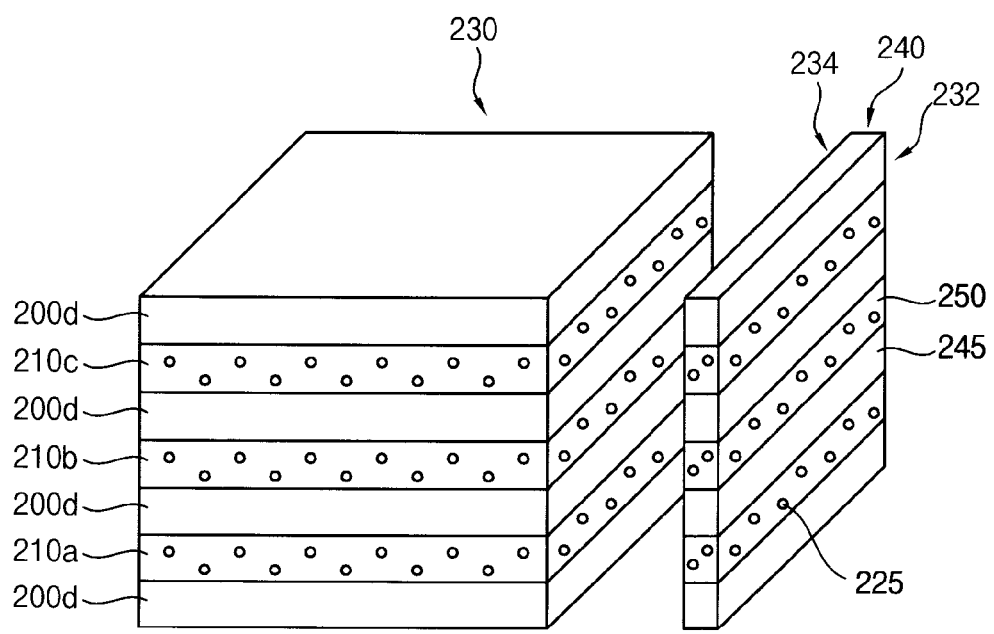

FIGS. 6 to 8 are perspective views illustrating a method of manufacturing an optical sheet in accordance with other example embodiments.

Referring to FIG. 6, a plurality of transparent layers 200 and a plurality of light scattering layers 210 may be stacked alternatively and repeatedly.

In example embodiments, hundreds or thousands of transparent layers 200 including a first transparent layer 200a, a second transparent layer 200b, a third transparent layer 200c and a fourth transparent layer 200d may be provided. Additionally, hundreds or thousands of light scattering layers 210 including a first light scattering layer 210a, a second light scattering layer 210b, a third light scattering layer 210c may be provided.

In example embodiments, each of the transparent layers 200 may include a material substantially the same as or substantially similar to that of the first transparent layer 100a described with reference to FIG. 1.

The light scattering layers 210a, 210b and 210c may include adhesives 220a, 220b and 220c and light scattering particles 225a, 225b and 225c, respectively. For example, the first light scattering layer 210a may include a first adhesive 220a and first light scattering particles 225a, the second light scattering layer 210b may include a second adhesive 220b and second light scattering particles 225b, and the third light scattering layer 210c may include a third adhesive 220c and third light scattering particles 225c. In example embodiments, each of the first to the third adhesives 220a, 220b and 220c may include a transparent pressure sensitive adhesive such as rubber-based adhesive, acryl-based adhesive, vinyl ester-based adhesive, silicon-based adhesive, urethane-based adhesive, etc. The first to the third light scattering particles 225a, 225b and 225c may have various shapes such as sphere shapes, disk shapes, bubble shapes, polygonal shapes, etc.

Referring to FIG. 7, the transparent layers 200 and the light scattering layers 210 may be laminated to provide a stacked structure 230.

The light scattering layers 210a, 210b and 210c may include the adhesives 220a, 220b and 220c, so that an additional adhesive for combining the transparent layers 200 with the light scattering layers 210 may not be required. In example embodiments, when each of the adhesives 220a, 220b and 220c includes a pressure sensitive adhesive, the transparent layers 200 and the light scattering layers 210 may be arranged alternatively and repeatedly, and then the stacked structure 230 may be obtained by applying predetermined pressure thereto.

For convenience of illustration and description, the stacked structure 230 may include four transparent layers 200 and three light scattering layers 210 as in FIG. 7, the present invention is not limited to the illustration. For example, the stacked structure 230 may include hundreds or thousands of the light scattering layers 210 and the transparent layers 200, which may be stacked alternatively and repeatedly.

Referring to FIG. 8, the stacked structure 230 may be cut to form a first cut face 232 and a second cut face 234, thereby forming an optical sheet 240.

The processes of cutting the stacked structure 230 may be substantially the same as, or substantially similar to, the processes described with reference to FIGS. 4 and 5. Therefore, the optical sheet 240 having the first cut face 232 and the second cut face 234 may be obtained. The optical sheet 240 may include transparent patterns 245 and light scattering patterns 250, which may be arranged alternatively and repeatedly. A distance between the first cut face 232 and the second cut face 234 may be substantially the same as a thickness of the optical sheet 240.

According to example embodiments, the optical sheet 240 including the transparent patterns 245 and the light scattering patterns 250 arranged alternatively and repeatedly may be obtained without performing any patterning process. Further, the light scattering layers 210 include the adhesives 220, so that additional adhesive layers may not be required.

FIGS. 9 to 12 are perspective views illustrating a method of manufacturing an optical sheet in accordance with other example embodiments.

Figure 9:
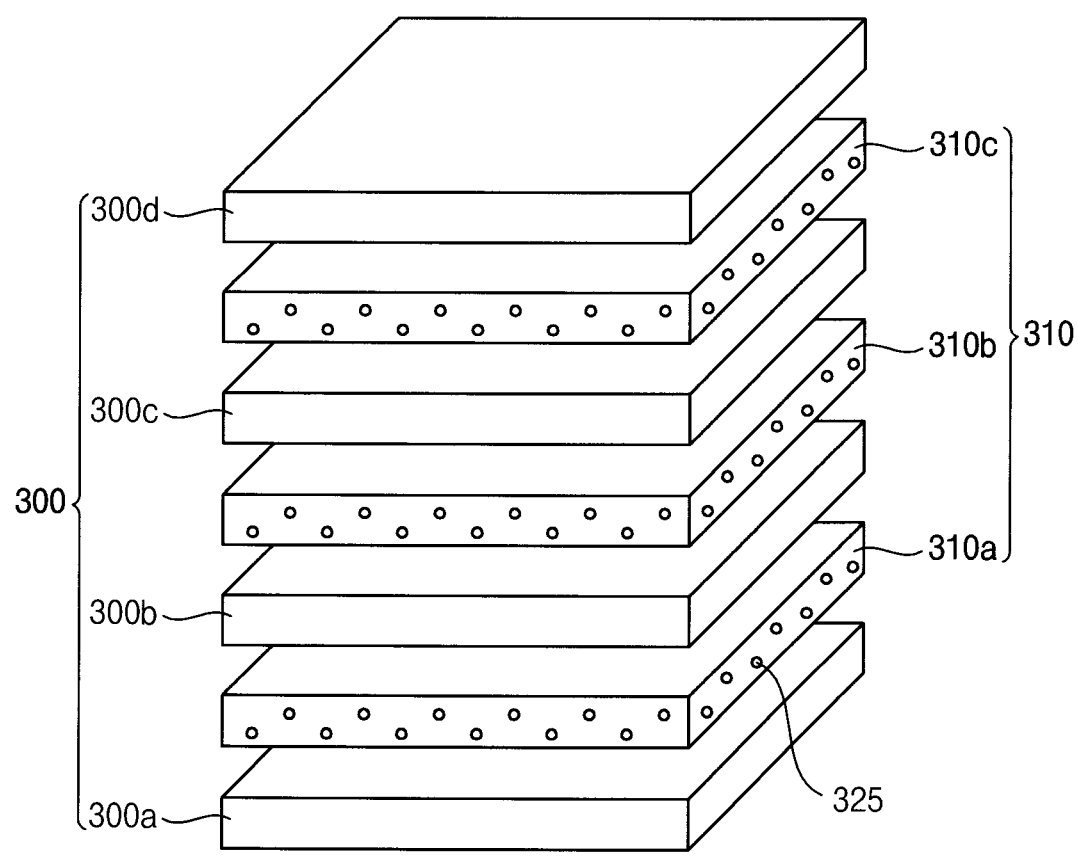

Referring to FIG. 9, transparent layers 300 and light scattering layers 310 may be stacked alternatively and repeatedly.

The transparent layers 300 and the light scattering layers 310 may include materials substantially the same as, or substantially similar to, those of the transparent layers 100 and the light scattering layers 110 described with reference to FIG. 3, respectively. The process of arranging the transparent layers 300 and the light scattering layers 310 may be substantially the same as, or substantially similar to, the process described with reference to FIG. 6. In example embodiments, a first light scattering layer 310a may be disposed between a first transparent layer 300a and a second transparent layer 300b, and the second transparent layer 300b may be positioned between the first light scattering layer 310a and a second light scattering layer 310b. A third light scattering layer 310c may be disposed between a third transparent layer 300c and a fourth transparent layer 300d.

Figure 10:
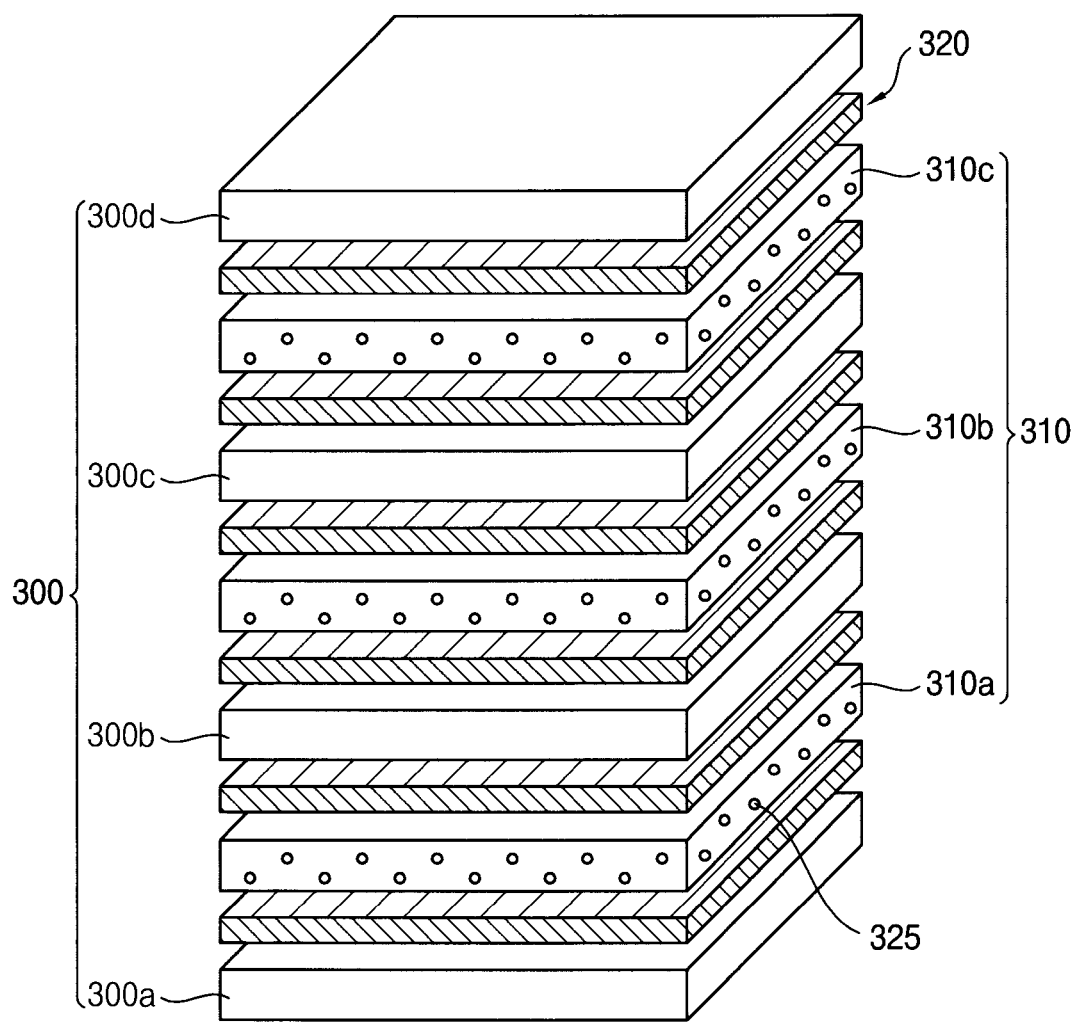

Referring to FIG. 10, adhesive layers 320 may be disposed between each of the transparent layers 300 and each of the light scattering layers 310.

The adhesive layers 320 may include a material substantially the same as that of the adhesives 220 described with reference to FIG. 6.

Figure 11:
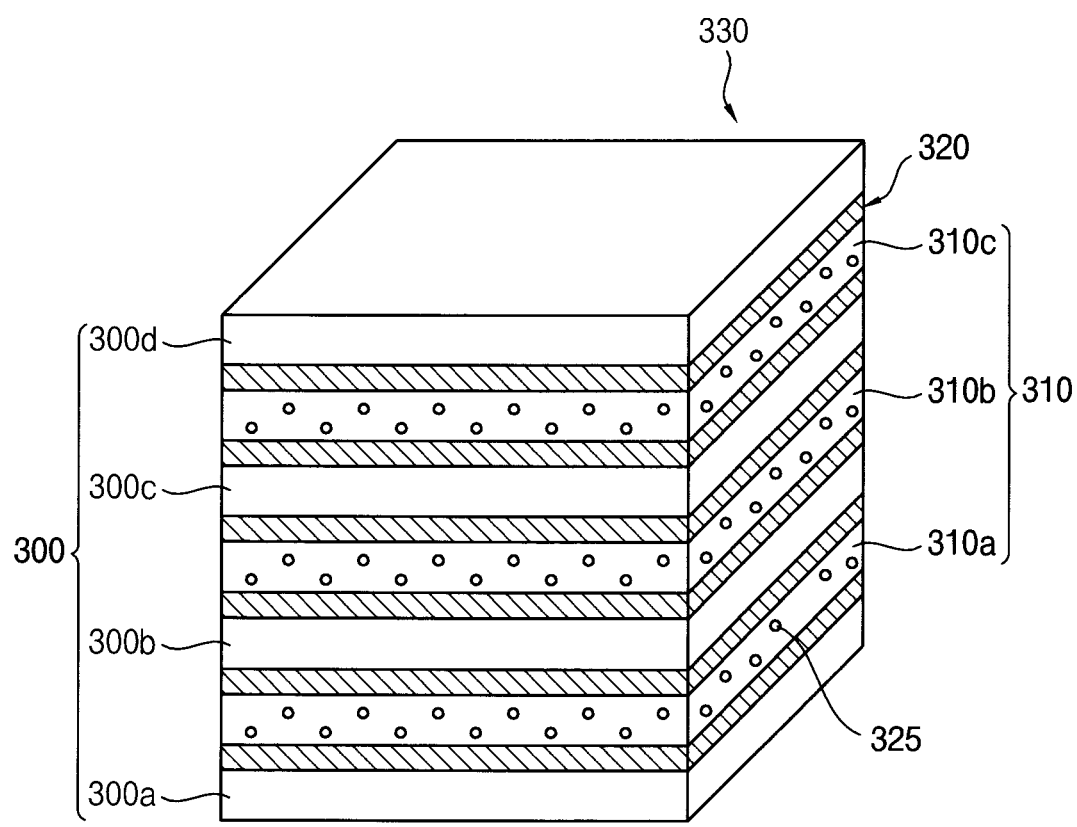

Referring to FIG. 11, the transparent layers 300, the light scattering layers 310 and the adhesive layers 320 may be laminated to form a stacked structure 330.

For convenience of illustration and description, the stacked structure 330 is depicted to include four transparent layers 300, three light scattering layers 310 and six adhesive layers 320 in FIG. 11, the invention is not limited to the illustration. For example, the stacked structure 330 may include hundreds or thousands of the transparent layers 300, the light scattering layers 310 and the adhesive layers 320 which may be stacked alternatively and repeatedly. In example embodiments, the number of the transparent layers 300 and the light scattering layers 310 may correspond to the number of pixels in one row or in one column of the display panel.

Figure 12:
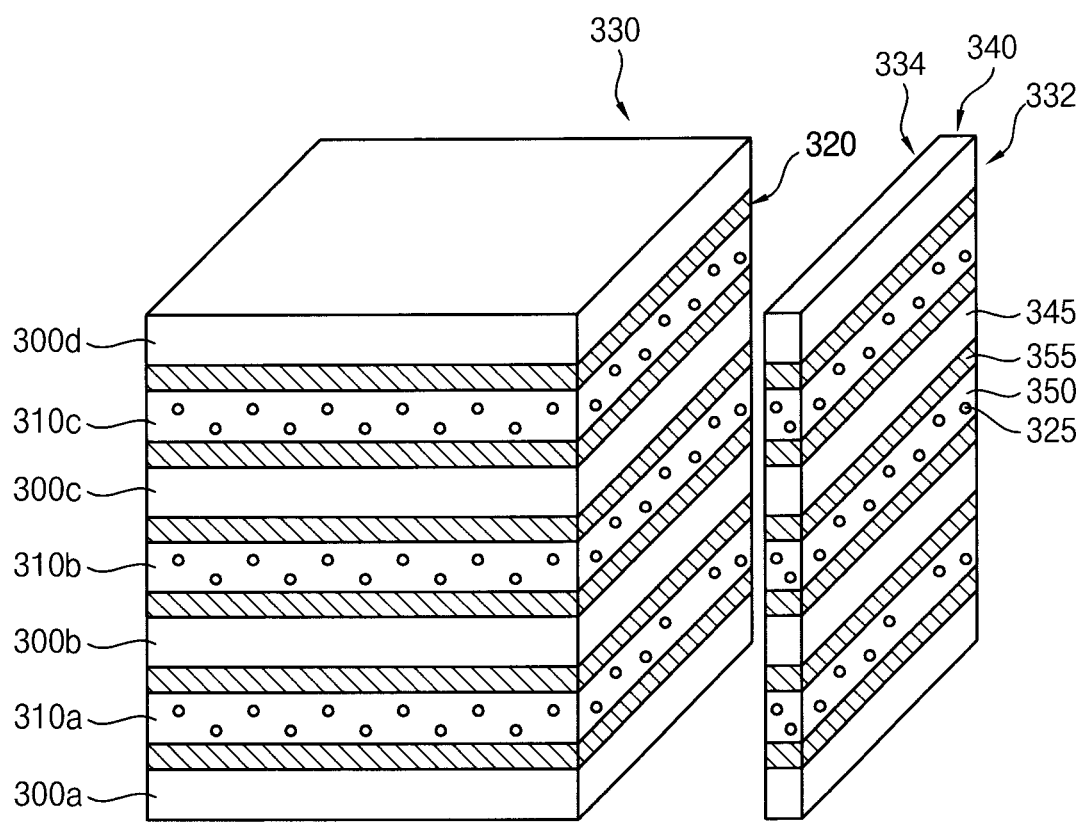

Referring to FIG. 12, the stacked structure 330 may be partially cut to form a first cut face 332 and a second cut face 334 to thereby provide an optical sheet 340.

The processes of cutting the stacked structure 330 to form the first and the second cut faces 332 and 334 may be substantially the same as, or substantially similar to, the processes described with reference to FIG. 8. Thus, the optical sheet 340 may include the transparent patterns 345, the light scattering patterns 350 and the adhesive patterns 355, which may be arranged alternatively and repeatedly.

According to Example embodiments, the optical sheet 340 having a plurality of transparent patterns 345, a plurality of light scattering patterns 350 and a plurality of adhesive patterns 355 arranged alternatively and repeatedly may be obtained without a patterning process.

Figure 13:
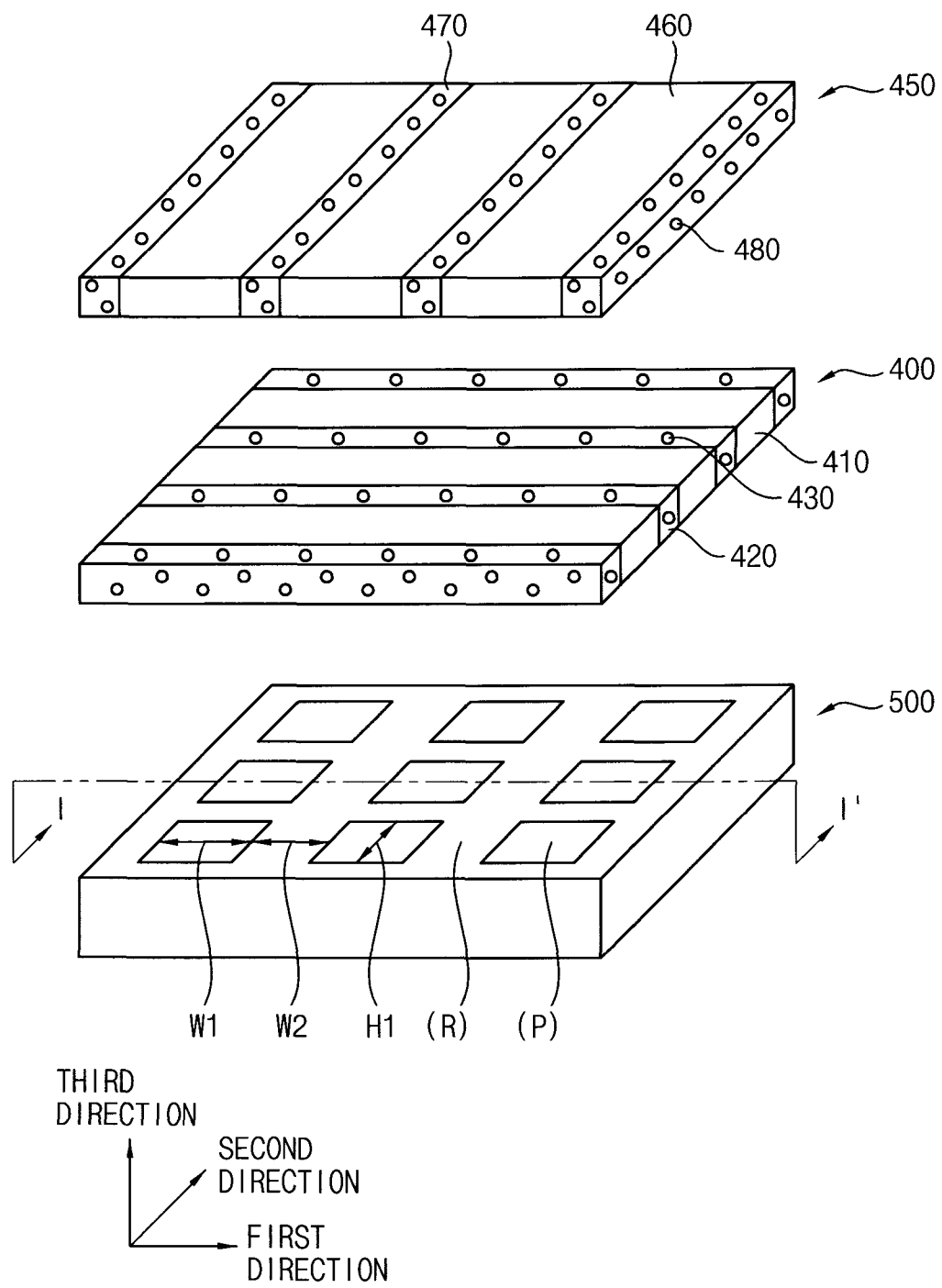
Figure 14:
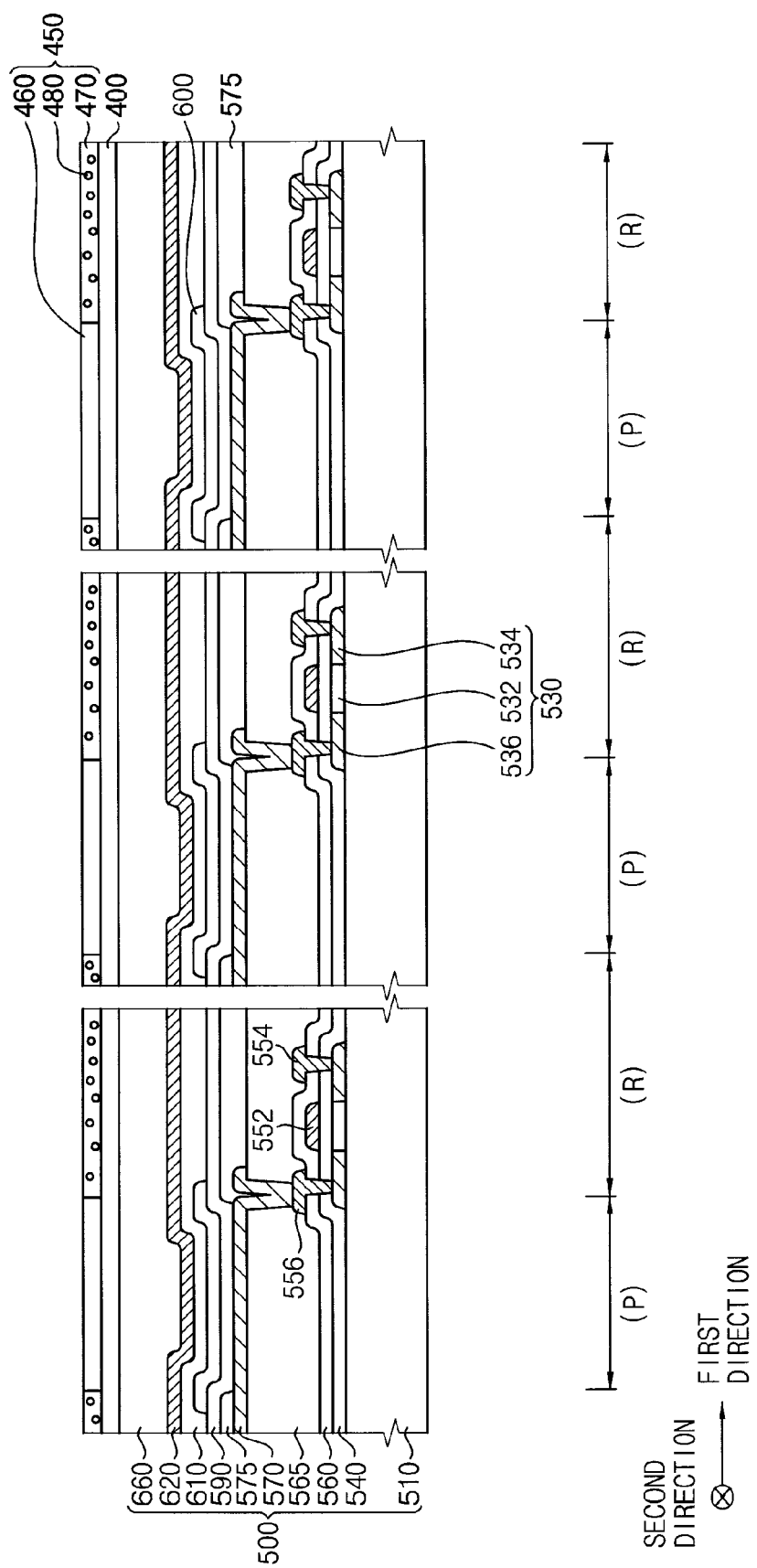

FIG. 13 is a perspective view illustrating an organic light emitting display device in accordance with example embodiments, and FIG. 14 is a cross sectional view illustrating the organic light emitting display device taken along a line I-I' in FIG. 13.

Referring to FIGS. 13 and 14, the organic light emitting display device may include a display panel 500, a first optical sheet 400, a second optical sheet 450, etc.

The display panel 500 may include pixel regions P and a peripheral region R. The pixel regions P may be arranged in a first direction and a second direction substantially perpendicular to the first direction. For example, the pixel regions P may be arranged in a substantial matrix structure. The peripheral region R may surround the pixel regions P. In example embodiments, the pixel regions P may have substantially the same areas, respectively. For example, each of the pixel regions P may have a first height H1 and a first width W1, and the peripheral region R may have a second width W2. The second width W2 of the peripheral region R may be substantially similar to or substantially smaller than the first width W1 of each pixel region P.

The display panel 500 may include a first substrate 510, a switching structure, a first electrode 570, a light emitting structure, a second electrode 620, etc. Although the organic light emitting display device illustrated in FIG. 14 may be a bottom emission type, the organic light emitting display device may be a top emission type in accordance with materials included in the first and the second electrodes 570 and 620.

The switching structure may be disposed on the first substrate 510, and the first electrode 570 may be positioned on the switching structure. The first electrode 570 may be electrically connected to the switching structure. The light emitting structure may be located between the first electrode 570 and the second electrode 620.

When the organic light emitting display device is an active matrix type, the switching structure may be disposed between the first substrate 510 and the first electrode 570. In example embodiments, the switching structure may include a switching device, at least one insulation layer, a contact, a pad, etc. The switching device may include a thin film transistor (TFT), an oxide semiconductor device, etc.

When the switching device in the switching structure includes the thin film transistor, the switching device may include a semiconductor layer 530, a gate electrode 552, a source electrode 554, a drain electrode 556, etc.

A gate signal may be applied to the gate electrode 552 from a gate line (not illustrated) while a data signal may be applied to the source electrode 554 from a data line (not illustrated). The drain electrode 556 may electrically contact the first electrode 570 and the semiconductor layer 530 may electrically contact both of the source electrode 554 and the drain electrode 556. The semiconductor layer 530 may include a source region 534 contacting the source electrode 554, a drain region 536 contacting the drain electrode 556 and a channel region 532 between the source region 534 and the drain region 536.

A gate insulation layer 540 electrically insulating the gate electrode 552 from the semiconductor layer 530 may be disposed on the semiconductor layer 530 and a first insulation layer 560 may be disposed on the gate insulation layer 540 to cover the gate electrode 552. The source and the drain electrodes 554 and 556 may pass through the first insulation layer 560 and the gate insulation layer 540 to contact the source and the drain regions 534 and 536, respectively.

In the organic light emitting display device illustrated in FIG. 14, the switching device including the thin film transistor may have a top gate configuration in which the gate electrode 552 may be disposed over the semiconductor layer 530, however, the configuration of the switching device may not be limited thereto. For example, the switching device may have a bottom gate configuration in which a gate electrode may be disposed under the semiconductor layer.

A second insulation layer 565 may be disposed on the first insulation layer 560 to cover the source electrode 554 and the drain electrode 556. In example embodiments, the second insulation layer 565 may have a substantially flat surface obtained by a planarization process, for example, a chemical mechanical polishing (CMP) process, an etch-back process, etc.

Referring to FIG. 14, the light emitting structure may include a hole transfer layer 590, an organic light emitting layer 600, an electron transfer layer 610, etc. The organic light emitting layer 600 may include an organic material or a mixture of an organic material and an inorganic material for generating a red color of light, a green color of light and/or a blue color of light. In some example embodiments, the organic light emitting layer 600 may have a stacked structure that includes a plurality of light emitting films for generating the red color of light, the green color of light and the blue color of light to thereby provide a white color of light.

The first electrode 570 may be disposed between the switching structure and the light emitting structure. The second electrode 620 may be disposed between the light emitting structure and the second substrate 660. A pixel defining layer 575 may be disposed in a region between the switching structure and the light emitting structure where the first electrode 570 is not positioned.

In example embodiments, the organic light emitting layer 600 may be positioned in each pixel region P, and the pixel defining layer 575 may be disposed in the peripheral region R. Therefore, light generated from the organic light emitting layer 600 may be emitted in the pixel regions P whereas the light may not be emitted in the peripheral region R. In other words, the pixel defining layer 575 may define each pixel region P of the organic light emitting display device.

In example embodiments, the first electrode 570 may serve as an anode for providing holes into the hole transfer layer 590 of the light emitting structure, and the second electrode 620 may serve as a cathode for supplying electrons into the electron transfer layer 610. Depending on an emission type of the organic light emitting display device, the first electrode 570 may be a transparent electrode or a semi-transparent electrode, and the second electrode 620 may be a reflective electrode. For example, the first electrode 570 may include a transparent conductive material such as indium tin oxide (ITO), zinc tin oxide (ZTO), indium zinc oxide (IZO), zinc oxide (ZnOx), tin oxide (SnOx), gallium oxide (GaOx), etc. The second electrode 620 may include a reflective material such as aluminum (Al), tungsten (W), copper (Cu), nickel (Ni), chromium (Cr), molybdenum (Mo), titanium (Ti), platinum (Pt), silver (Ag), tantalum (Ta), ruthenium (Ru), alloys thereof, nitrides thereof, etc. These may be used alone or in a combination thereof.

The second substrate 660 may be disposed on the second electrode 620. The second substrate 660 may include a transparent substrate such as a glass substrate, a quartz substrate, a transparent resin substrate, etc. Alternatively, the second substrate 660 may include a flexible material. The second substrate 660 may substantially face the first substrate 510.

The first optical sheet 400 may be disposed on the second substrate 660. The first optical sheet 400 may be substantially the same as, or substantially similar to the optical sheet described with reference to FIGS. 1 to 6. That is, the first optical sheet 400 may include first transparent patterns 410 and first light scattering patterns 420, which may be alternatively disposed on the second substrate 660. That is, adjacent first transparent patterns 410 may be separated by interposing the first light scattering pattern 420 therebetween, and also adjacent first light scattering patterns 420 may be spaced apart by interposing the first transparent pattern 410 therebetween. Each of the first transparent patterns 410 and the first light scattering patterns 420 may extend on the second substrate 660 in the first direction. As illustrated in FIG. 13, a plurality of first transparent patterns 410 and a plurality of first light scattering patterns 420 may be arranged substantially parallel to one another. Each of the first light scattering patterns 420 may include first light scattering particles 430.

In example embodiments, a width of each first transparent pattern 410 may be substantially the same as, or substantially similar to, the first height H1 of each pixel region P, and a width of each first light scattering pattern 420 may be substantially the same as, or substantially similar to, the second width W2 of the peripheral region R. For example, the width of each first transparent pattern 410 may be larger by a factor of an integer than the first height H1 of each pixel region P, and the width of each first light scattering pattern 420 may be substantially the same as the second width W2 of the peripheral region R. Accordingly, the first light scattering patterns 420 may be disposed to be substantially overlapped with the peripheral region R of the display panel 500.

The second optical sheet 450 may have a configuration substantially the same as that of the first optical sheet 400. The second optical sheet 450 may include second transparent patterns 460 and second light scattering patterns 470, which may alternatively disposed on the first optical sheet 400 in the second direction.

In example embodiments, a width of each second transparent pattern 460 may be substantially the same as, or substantially similar to, the first width W1 of each pixel region P, and a width of each second light scattering pattern 470 may be substantially the same as, or substantially similar to, the second width W2 of the peripheral region R. Accordingly, the second light scattering patterns 470 may be disposed to be substantially overlapped with the peripheral region R of the display panel 500.

According to example embodiments, the first transparent patterns 410 and the second transparent patterns 460 may be positioned to be substantially corresponding to the pixel regions P of the display panel 500. Light emitted along a front direction of the display panel 500 may pass through the first transparent patterns 410 and the second transparent patterns 460, so that brightness of the light may not decrease due to the first transparent patterns 410 and the second transparent patterns 460. The first light scattering patterns 420 and the second light scattering patterns 470 may be positioned to substantially correspond to the peripheral region R of the display panel 500. Light emitted along a lateral direction of the display panel 500 may pass through the first light scattering patterns 420 or the second light scattering patterns 470, and thus color shift phenomenon may decrease. Therefore, quality of images on the display device may be improved by reducing the color shift phenomenon.

Figure 15:
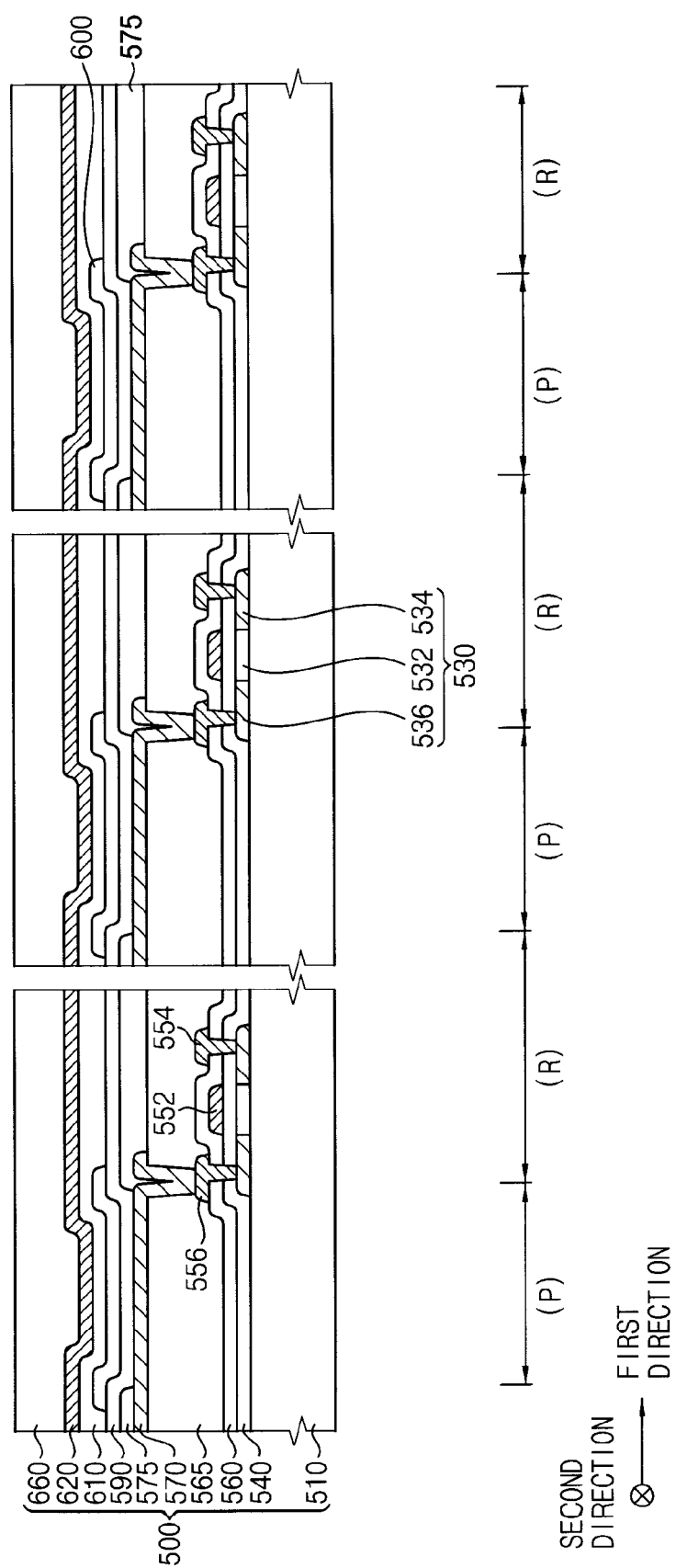
Figure 16:
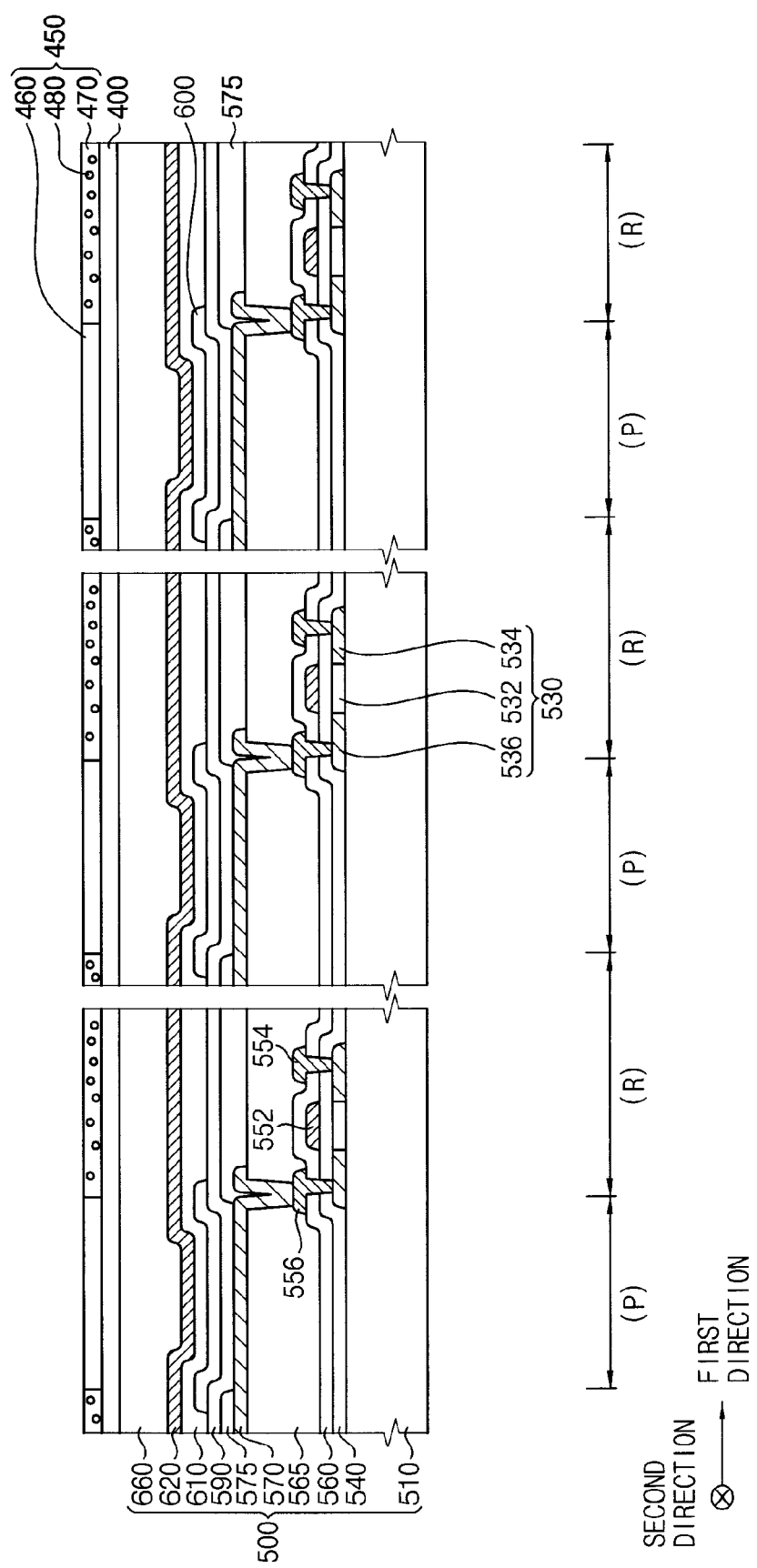

FIGS. 15 and 16 are cross-sectional views illustrating a method of manufacturing an organic light emitting display device in accordance with example embodiments.

Referring to FIG. 15, a display panel 500 of the organic light emitting display device may be provided. The display panel 500 may have a construction substantially the same as, or substantially similar to, that of the display panel 500 described with reference to FIG. 14, and thus detail descriptions thereof will be omitted.

Referring to FIG. 16, a first optical sheet 400 and a second optical sheet 450 may be formed on the display panel 500. In example embodiments, the processes of manufacturing the first optical sheet 400 and the second optical sheet 450 may be substantially the same as, or substantially similar to, the processes described with reference to FIGS. 1 to 12.

Thus, detailed descriptions of the processes of manufacturing the first and the second optical sheets 400 and 450 will be omitted.

The first optical sheet 400 may be disposed on the display panel 500. In example embodiments, first light scattering patterns of the first optical sheet 400 may be substantially overlapped with a peripheral region RI of the display panel 500, and first transparent patterns of the first optical sheet 400 may be substantially overlapped with pixel regions P of the display panel 500. For example, the first light scattering patterns may extend in the first direction on the display panel 500.

The second optical sheet 450 may be positioned on the first optical sheet 400. Second light scattering patterns 470 of the second optical sheet 450 may be substantially perpendicular to the first light scattering patterns of the first optical sheet 400. That is, second transparent patterns 460 and the second light scattering patterns 470 may extend in a second direction substantially perpendicular to the first direction. In example embodiments, the second light scattering patterns 470 of the second optical sheet 450 may be substantially overlapped with the peripheral region R of the display panel 500, and the second transparent patterns 460 may be substantially overlapped with the pixel regions P of the display panel 500.

According to example embodiments, the first and the second optical sheets having a plurality of first and second transparent patterns and a plurality of first and second light scattering patterns, which may be arranged alternatively and repeatedly on the display panel, may be formed without performing any patterning process such as an etching process. The first and the second optical sheets may not reduce brightness of light emitted along a front direction of the display panel, and may alleviate color shift phenomenon. Therefore, quality of images of the organic light emitting display device may be improved.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of manufacturing an optical sheet, the method comprising:
    forming a stacked structure by alternatively and repeatedly stacking at least one transparent layer and at least one light scattering layer, wherein forming the stacked structure includes:
        providing a plurality of transparent layers;
        providing a plurality of light scattering layers;
        alternatively arranging the transparent layers and the light scattering layers; and
        laminating the transparent layers and the light scattering layers;
        forming adhesion layers between the transparent layers and the light scattering layers, respectively;
    forming a first cut face by partially cutting the stacked structure; and
    forming a second cut face by partially cutting the stacked structure, the second cut face being parallel to the first cut face.

2. The method of claim 1, wherein a distance between the first cut face and the second cut face corresponds to a thickness of the optical sheet.

3. The method of claim 1, wherein the first cut face and the second cut face are perpendicular to an interface between the transparent layer and the light scattering layer.

4. The method of claim 1, wherein forming the stacked structure comprises repeatedly performing a cycle including forming one light scattering layer on one transparent layer and forming another transparent layer on the light scattering layer.

5. The method of claim 1, wherein each of the light scattering layers includes a transparent adhesive and a plurality of light scattering particles.

6. The method of claim 1, wherein each of the transparent layers has an identical thickness, and each of the light scattering layers has an identical thickness.

7. The method of claim 1, wherein transparent layers respectively have different thicknesses and the light scattering layers respectively have different thicknesses.

8. The method of claim 1, wherein each of the light scattering layers comprises light scattering particles having one of a sphere shape, a disk shape, a bubble shape or a polygonal shape.

9. A method of manufacturing an organic light emitting display device, the method comprising:
    forming a display panel including a switching device, a first electrode, an organic light emitting structure and a second electrode, the display panel having a plurality of pixel regions and a peripheral region surrounding the pixel regions, the pixel regions being arranged in a first direction and a second direction perpendicular to the first direction; and
    forming an optical sheet on the display panel,
    wherein forming the optical sheet includes:
        forming a stacked structure by alternatively stacking at least one transparent layer and at least one light scattering layer;
        forming a first cut face by partially cutting the stacked structure; and
        forming a second cut face by partially cutting the stacked structure, the second cut face being parallel to the first cut face, to form at least one optical sheet including light scattering patterns and transparent patterns extending in the first direction, adjacent light scattering patterns and adjacent transparent patterns being spaced apart in the second direction.

10. The method of claim 9, wherein a distance between the first cut face and second cut face is a thickness of the optical sheet.

11. The method of claim 9, wherein the first cut face and the second cut face are perpendicular to an interface between the transparent layer and the light scattering layer.

12. The method of claim 9, wherein the transparent patterns have equal widths and the light scattering patterns have equal widths.

13. The method of claim 12, wherein the widths of the transparent patterns are larger by a factor of an integer than widths or heights of the pixel regions.

14. The method of claim 9, wherein forming the optical sheet on the display panel includes:

forming a first optical sheet including first light scattering patterns and first transparent patterns extending in the first direction on the display panel, adjacent first light scattering patterns and adjacent first transparent patterns being spaced apart in the second direction; and forming a second optical sheet including second light scattering patterns and second transparent patterns extending in the second direction on the first optical sheet, adjacent second light scattering patterns and adjacent second transparent patterns being spaced apart in the first direction.

\* \* \* \* \*